United States Patent
Knopf

(10) Patent No.: US 7,408,358 B2
(45) Date of Patent: Aug. 5, 2008

(54) ELECTRONIC BATTERY TESTER HAVING A USER INTERFACE TO CONFIGURE A PRINTER

(75) Inventor: Roger Knopf, Elmhurst, IL (US)

(73) Assignee: Midtronics, Inc., Willowbrook, IL (US)

( * ) Notice: Subject to any disclaimer, the term of this patent is extended or adjusted under 35 U.S.C. 154(b) by 0 days.

(21) Appl. No.: 10/462,323

(22) Filed: Jun. 16, 2003

(65) Prior Publication Data
US 2004/0251908 A1    Dec. 16, 2004

(51) Int. Cl.
*G01N 27/416*    (2006.01)
(52) U.S. Cl. ..................................... 324/426
(58) Field of Classification Search ............... 324/426; 431/196; 704/275
See application file for complete search history.

(56) References Cited

U.S. PATENT DOCUMENTS

| | | | |
|---|---|---|---|
| 2,000,665 A | 5/1935 | Neal | 439/440 |
| 2,514,745 A | 7/1950 | Dalzell | 324/115 |
| 3,356,936 A | 12/1967 | Smith | 324/429 |
| 3,562,634 A | 2/1971 | Latner | 324/427 |
| 3,593,099 A | 7/1971 | Scholl | 320/127 |
| 3,607,673 A | 9/1971 | Seyl | 324/425 |
| 3,652,341 A | 3/1972 | Halsall et al. | 29/623.2 |
| 3,676,770 A | 7/1972 | Sharaf et al. | 324/430 |
| 3,729,989 A | 5/1973 | Little | 73/862.192 |
| 3,750,011 A | 7/1973 | Kreps | 324/430 |
| 3,753,094 A | 8/1973 | Furuishi et al. | 324/430 |
| 3,796,124 A | 3/1974 | Crosa | 411/521 |
| 3,808,522 A | 4/1974 | Sharaf | 324/430 |
| 3,811,089 A | 5/1974 | Strezelewicz | 324/170 |
| 3,873,911 A | 3/1975 | Champlin | 324/430 |
| 3,876,931 A | 4/1975 | Godshalk | 324/429 |
| 3,886,443 A | 5/1975 | Miyakawa et al. | 324/426 |
| 3,889,248 A | 6/1975 | Ritter | 340/636.11 |
| 3,906,329 A | 9/1975 | Bader | 320/134 |
| 3,909,708 A | 9/1975 | Champlin | 324/431 |

(Continued)

FOREIGN PATENT DOCUMENTS

DE        29 26 716 B1    1/1981

(Continued)

OTHER PUBLICATIONS

Travsys Software Solutions, Aug. 1999, Comms Client Pro for Windows @ http://www.travsys.nl/ccp-pd-ts-002.htm, pp. 1-10.*

(Continued)

*Primary Examiner*—Edward Tso
(74) *Attorney, Agent, or Firm*—Westman, Champlin & Kelly, P.A.

(57) ABSTRACT

An apparatus for testing a storage battery includes an input configured to select a printer protocol from a plurality of printer protocols. A memory contains a plurality of printer protocol selection commands. Each of the printer protocol selection commands corresponds with each of the printer protocols. A processor is coupled to the input and the memory such that the processor can retrieve one of the plurality of printer protocol selection commands that corresponds to the selected printer protocol. A communication interface is configured to send the printer protocol selection command to a printer, the printer protocol selection command is configured to cause the printer to communicate in accordance with the selected printer protocol.

12 Claims, 6 Drawing Sheets

U.S. PATENT DOCUMENTS

| | | | | |
|---|---|---|---|---|
| 3,936,744 A | 2/1976 | Perlmutter | | 324/772 |
| 3,946,299 A | 3/1976 | Christianson et al. | | 320/430 |
| 3,947,757 A | 3/1976 | Grube et al. | | 324/416 |
| 3,969,667 A | 7/1976 | McWilliams | | 324/427 |
| 3,979,664 A | 9/1976 | Harris | | 324/397 |
| 3,984,762 A | 10/1976 | Dowgiallo, Jr. | | 324/430 |
| 3,984,768 A | 10/1976 | Staples | | 324/712 |
| 3,989,544 A | 11/1976 | Santo | | 429/65 |
| 4,008,619 A | 2/1977 | Alcaide et al. | | 73/724 |
| 4,023,882 A | 5/1977 | Pettersson | | 439/426 |
| 4,024,953 A | 5/1977 | Nailor, III | | 206/344 |
| 4,047,091 A | 9/1977 | Hutchines et al. | | 363/59 |
| 4,053,824 A | 10/1977 | Dupuis et al. | | 324/430 |
| 4,056,764 A | 11/1977 | Endo et al. | | 320/101 |
| 4,070,624 A | 1/1978 | Taylor | | 324/772 |
| 4,086,531 A | 4/1978 | Bernier | | 324/772 |
| 4,112,351 A | 9/1978 | Back et al. | | 324/380 |
| 4,114,083 A | 9/1978 | Benham et al. | | 340/636.13 |
| 4,126,874 A | 11/1978 | Suzuki et al. | | 396/301 |
| 4,160,916 A | 7/1979 | Papasideris | | 307/10.6 |
| 4,178,546 A | 12/1979 | Hulls et al. | | 324/772 |
| 4,193,025 A | 3/1980 | Frailing et al. | | 324/427 |
| 4,207,611 A | 6/1980 | Gordon | | 701/33 |
| 4,217,645 A | 8/1980 | Barry et al. | | 702/63 |
| 4,280,457 A | 7/1981 | Bloxham | | 123/198 R |
| 4,297,639 A | 10/1981 | Branham | | 324/429 |
| 4,315,204 A | 2/1982 | Sievers et al. | | 322/28 |
| 4,316,185 A | 2/1982 | Watrous et al. | | 320/116.11 |
| 4,322,685 A | 3/1982 | Frailing et al. | | 324/429 |
| 4,351,405 A | 9/1982 | Fields et al. | | 180/65.2 |
| 4,352,067 A | 9/1982 | Ottone | | 324/434 |
| 4,360,780 A | 11/1982 | Skutch, Jr. | | 324/437 |
| 4,361,809 A | 11/1982 | Bil et al. | | 324/426 |
| 4,363,407 A | 12/1982 | Buckler et al. | | 209/3.3 |
| 4,369,407 A | 1/1983 | Korbell | | 324/416 |
| 4,379,989 A | 4/1983 | Kurz et al. | | 320/165 |
| 4,379,990 A | 4/1983 | Sievers et al. | | 322/99 |
| 4,385,269 A | 5/1983 | Aspinwall et al. | | 320/129 |
| 4,390,828 A | 6/1983 | Converse et al. | | 320/153 |
| 4,392,101 A | 7/1983 | Saar et al. | | 320/156 |
| 4,396,880 A | 8/1983 | Windebank | | 320/156 |
| 4,408,157 A | 10/1983 | Beaubien | | 324/712 |
| 4,412,169 A | 10/1983 | Dell'Orto | | 320/123 |
| 4,423,378 A | 12/1983 | Marino et al. | | 324/427 |
| 4,423,379 A | 12/1983 | Jacobs et al. | | 324/429 |
| 4,424,491 A | 1/1984 | Bobbett et al. | | 324/433 |
| 4,459,548 A | 7/1984 | Lentz et al. | | 324/472 |
| 4,514,694 A | 4/1985 | Finger | | 324/429 |
| 4,520,353 A | 5/1985 | McAuliffe | | 340/636.16 |
| 4,564,798 A | 1/1986 | Young | | 320/103 |
| 4,620,767 A | 11/1986 | Woolf | | 439/217 |
| 4,633,418 A | 12/1986 | Bishop | | 702/63 |
| 4,659,977 A | 4/1987 | Kissel et al. | | 320/150 |
| 4,663,580 A | 5/1987 | Wortman | | 320/153 |
| 4,665,370 A | 5/1987 | Holland | | 324/429 |
| 4,667,143 A | 5/1987 | Cooper et al. | | 320/153 |
| 4,667,279 A | 5/1987 | Maier | | 363/46 |
| 4,678,998 A | 7/1987 | Muramatsu | | 324/427 |
| 4,679,000 A | 7/1987 | Clark | | 324/428 |
| 4,680,528 A | 7/1987 | Mikami et al. | | 320/165 |
| 4,686,442 A | 8/1987 | Radomski | | 320/123 |
| 4,697,134 A | 9/1987 | Burkum et al. | | 320/134 |
| 4,707,795 A | 11/1987 | Alber et al. | | 702/63 |
| 4,709,202 A | 11/1987 | Koenck et al. | | 320/112 |
| 4,710,861 A | 12/1987 | Kanner | | 363/46 |
| 4,719,428 A | 1/1988 | Liebermann | | 324/436 |
| 4,723,656 A | 2/1988 | Kiernan et al. | | 206/705 |
| 4,743,855 A | 5/1988 | Randin et al. | | 324/430 |
| 4,745,349 A | 5/1988 | Palanisamy et al. | | 320/125 |
| 4,816,768 A | 3/1989 | Champlin | | 324/428 |
| 4,820,966 A | 4/1989 | Fridman | | 320/116 |
| 4,825,170 A | 4/1989 | Champlin | | 324/436 |
| 4,847,547 A | 7/1989 | Eng, Jr. et al. | | 320/153 |
| 4,849,700 A | 7/1989 | Morioka et al. | | 324/427 |
| 4,874,679 A | 10/1989 | Miyagawa | | 429/91 |
| 4,876,495 A | 10/1989 | Palanisamy et al. | | 320/106 |
| 4,881,038 A | 11/1989 | Champlin | | 324/426 |
| 4,888,716 A | 12/1989 | Ueno | | 702/63 |
| 4,912,416 A | 3/1990 | Champlin | | 324/430 |
| 4,913,116 A | 4/1990 | Katogi et al. | | 123/406.32 |
| 4,926,330 A | 5/1990 | Abe et al. | | 701/33 |
| 4,929,931 A | 5/1990 | McCuen | | 340/636.15 |
| 4,931,738 A | 6/1990 | MacIntyre et al. | | 324/435 |
| 4,933,845 A | 6/1990 | Hayes | | 710/104 |
| 4,934,957 A | 6/1990 | Bellusci | | 439/504 |
| 4,937,528 A | 6/1990 | Palanisamy | | 324/430 |
| 4,947,124 A | 8/1990 | Hauser | | 324/430 |
| 4,949,046 A | 8/1990 | Seyfang | | 324/427 |
| 4,956,597 A | 9/1990 | Heavey et al. | | 320/129 |
| 4,968,941 A | 11/1990 | Rogers | | 324/428 |
| 4,968,942 A | 11/1990 | Palanisamy | | 324/430 |
| 5,004,979 A | 4/1991 | Marino et al. | | 324/160 |
| 5,032,825 A | 7/1991 | Kuznicki | | 340/636.15 |
| 5,037,778 A | 8/1991 | Stark et al. | | 228/121 |
| 5,047,722 A | 9/1991 | Wurst et al. | | 324/430 |
| 5,081,565 A | 1/1992 | Nabha et al. | | 362/465 |
| 5,087,881 A | 2/1992 | Peacock | | 324/378 |
| 5,095,223 A | 3/1992 | Thomas | | 307/110 |
| 5,108,320 A | 4/1992 | Kimber | | 439/883 |
| 5,126,675 A | 6/1992 | Yang | | 324/435 |
| 5,140,269 A | 8/1992 | Champlin | | 324/433 |
| 5,144,218 A | 9/1992 | Bosscha | | 320/139 |
| 5,144,248 A | 9/1992 | Alexandres et al. | | 324/428 |
| 5,159,272 A | 10/1992 | Rao et al. | | 324/429 |
| 5,160,881 A | 11/1992 | Schramm et al. | | 322/7 |
| 5,170,124 A | 12/1992 | Blair et al. | | 324/434 |
| 5,179,335 A | 1/1993 | Nor | | 320/159 |
| 5,194,799 A | 3/1993 | Tomantschger | | 320/103 |
| 5,204,611 A | 4/1993 | Nor et al. | | 320/145 |
| 5,214,370 A | 5/1993 | Harm et al. | | 320/152 |
| 5,214,385 A | 5/1993 | Gabriel et al. | | 324/434 |
| 5,241,275 A | 8/1993 | Fang | | 324/430 |
| 5,254,952 A | 10/1993 | Salley et al. | | 324/429 |
| 5,266,880 A | 11/1993 | Newland | | 320/125 |
| 5,281,919 A | 1/1994 | Palanisamy | | 324/427 |
| 5,281,920 A | 1/1994 | Wurst | | 324/430 |
| 5,281,955 A * | 1/1994 | Reich et al. | | 340/636.12 |
| 5,295,078 A | 3/1994 | Stich et al. | | 700/297 |
| 5,298,797 A | 3/1994 | Redl | | 327/387 |
| 5,300,874 A | 4/1994 | Shimamoto et al. | | 320/106 |
| 5,302,902 A | 4/1994 | Groehl | | 324/434 |
| 5,313,152 A | 5/1994 | Wozniak et al. | | 320/118 |
| 5,315,287 A | 5/1994 | Sol | | 340/455 |
| 5,321,626 A | 6/1994 | Palladino | | 702/63 |
| 5,321,627 A | 6/1994 | Reher | | 702/63 |
| 5,323,337 A | 6/1994 | Wilson et al. | | 702/73 |
| 5,325,041 A | 6/1994 | Briggs | | 320/149 |
| 5,331,268 A | 7/1994 | Patino et al. | | 320/158 |
| 5,336,993 A | 8/1994 | Thomas et al. | | 324/158.1 |
| 5,338,515 A | 8/1994 | Dalla Betta et al. | | 422/95 |
| 5,339,018 A | 8/1994 | Brokaw | | 320/147 |
| 5,343,380 A | 8/1994 | Champlin | | 363/46 |
| 5,347,163 A | 9/1994 | Yoshimura | | 307/66 |
| 5,352,968 A | 10/1994 | Reni et al. | | 320/136 |
| 5,357,519 A | 10/1994 | Martin et al. | | 371/15.1 |
| 5,365,160 A | 11/1994 | Leppo et al. | | 320/160 |
| 5,365,453 A | 11/1994 | Startup et al. | | 702/36 |
| 5,369,364 A | 11/1994 | Renirie et al. | | 324/430 |
| 5,381,096 A | 1/1995 | Hirzel | | 324/427 |
| 5,402,007 A | 3/1995 | Center et al. | | 290/40 R |
| 5,410,754 A | 4/1995 | Klotzbach et al. | | 370/466 |
| 5,412,308 A | 5/1995 | Brown | | 323/267 |
| 5,412,323 A | 5/1995 | Kato et al. | | 324/429 |
| 5,425,041 A | 6/1995 | Seko et al. | | 372/45.01 |

| | | | |
|---|---|---|---|
| 5,426,371 A | 6/1995 | Salley et al. ............... 324/429 |
| 5,426,416 A | 6/1995 | Jefferies et al. ............ 340/664 |
| 5,432,025 A | 7/1995 | Cox ............................ 429/65 |
| 5,432,426 A | 7/1995 | Yoshida ....................... 320/160 |
| 5,434,495 A | 7/1995 | Toko ........................... 320/135 |
| 5,435,185 A | 7/1995 | Eagan .......................... 73/587 |
| 5,442,274 A | 8/1995 | Tamai .......................... 320/146 |
| 5,445,026 A | 8/1995 | Eagan .......................... 73/591 |
| 5,449,996 A | 9/1995 | Matsumoto et al. ......... 320/148 |
| 5,449,997 A | 9/1995 | Gilmore et al. ............. 320/148 |
| 5,451,881 A | 9/1995 | Finger ......................... 324/433 |
| 5,453,027 A | 9/1995 | Buell et al. .................. 439/433 |
| 5,457,377 A | 10/1995 | Jonsson ....................... 324/430 |
| 5,469,043 A | 11/1995 | Cherng et al. ............... 320/161 |
| 5,485,090 A | 1/1996 | Stephens ..................... 324/433 |
| 5,488,300 A | 1/1996 | Jamieson ..................... 324/432 |
| 5,508,599 A | 4/1996 | Koench ....................... 320/138 |
| 5,519,383 A | 5/1996 | De La Rosa ........... 340/636.15 |
| 5,528,148 A | 6/1996 | Rogers ........................ 320/137 |
| 5,537,967 A | 7/1996 | Tashiro et al. ............. 123/192.1 |
| 5,541,489 A | 7/1996 | Dunstan ....................... 320/134 |
| 5,546,317 A | 8/1996 | Andrieu ....................... 702/63 |
| 5,548,273 A | 8/1996 | Nicol et al. ................... 340/439 |
| 5,550,485 A | 8/1996 | Falk ............................. 324/772 |
| 5,561,380 A | 10/1996 | Sway-Tin et al. ............ 324/509 |
| 5,562,501 A | 10/1996 | Kinoshita et al. ............ 439/852 |
| 5,563,496 A | 10/1996 | McClure ...................... 320/128 |
| 5,572,136 A | 11/1996 | Champlin .................... 324/426 |
| 5,574,355 A | 11/1996 | McShane et al. ............ 320/161 |
| 5,578,915 A | 11/1996 | Crouch, Jr. et al. .......... 324/428 |
| 5,583,416 A | 12/1996 | Klang ......................... 320/160 |
| 5,585,728 A | 12/1996 | Champlin .................... 324/427 |
| 5,589,757 A | 12/1996 | Klang ......................... 320/160 |
| 5,592,093 A | 1/1997 | Klingbiel ..................... 324/426 |
| 5,592,094 A | 1/1997 | Ichikawa ..................... 324/427 |
| 5,596,260 A | 1/1997 | Moravec et al. ............. 320/135 |
| 5,598,098 A | 1/1997 | Champlin .................... 324/430 |
| 5,602,462 A | 2/1997 | Stich et al. ................... 323/258 |
| 5,606,242 A | 2/1997 | Hull et al. .................... 320/106 |
| 5,614,788 A | 3/1997 | Mullins et al. ................ 315/82 |
| 5,621,298 A | 4/1997 | Harvey ........................ 320/134 |
| 5,633,985 A | 5/1997 | Severson et al. ............. 704/267 |
| 5,637,978 A | 6/1997 | Kellett et al. ................. 320/104 |
| 5,642,031 A | 6/1997 | Brotto .......................... 320/156 |
| 5,650,937 A | 7/1997 | Bounaga ....................... 702/65 |
| 5,652,501 A | 7/1997 | McClure et al. ......... 340/636.15 |
| 5,653,659 A | 8/1997 | Kunibe et al. ................ 477/111 |
| 5,654,623 A | 8/1997 | Shiga et al. .................. 320/106 |
| 5,656,920 A | 8/1997 | Cherng et al. ............... 324/431 |
| 5,661,368 A | 8/1997 | Deol et al. .................... 315/82 |
| 5,675,234 A | 10/1997 | Greene .................... 340/636.11 |
| 5,677,077 A | 10/1997 | Faulk ........................... 429/90 |
| 5,684,678 A | 11/1997 | Barrett ......................... 363/17 |
| 5,699,050 A | 12/1997 | Kanazawa ............. 340/636.13 |
| 5,701,089 A | 12/1997 | Perkins ........................ 324/772 |
| 5,705,929 A * | 1/1998 | Caravello et al. ............ 324/430 |
| 5,707,015 A | 1/1998 | Guthrie ........................ 241/20 |
| 5,710,503 A | 1/1998 | Sideris et al. ................ 320/116 |
| 5,711,648 A | 1/1998 | Hammerslag ............... 414/800 |
| 5,717,336 A | 2/1998 | Basell et al. ................. 324/430 |
| 5,717,937 A | 2/1998 | Fritz ............................ 713/300 |
| 5,739,667 A | 4/1998 | Matsuda et al. ............. 320/128 |
| 5,745,044 A | 4/1998 | Hyatt, Jr. et al. ............ 340/5.23 |
| 5,747,909 A | 5/1998 | Syverson et al. ....... 310/156.56 |
| 5,747,967 A | 5/1998 | Muljadi et al. .............. 320/148 |
| 5,754,417 A | 5/1998 | Nicollini ...................... 363/60 |
| 5,757,192 A | 5/1998 | McShane et al. ............ 324/427 |
| 5,760,587 A | 6/1998 | Harvey ........................ 324/434 |
| 5,772,468 A | 6/1998 | Kowalski et al. ............ 439/506 |
| 5,773,978 A | 6/1998 | Becker ........................ 324/430 |
| 5,780,974 A | 7/1998 | Pabla et al. ................... 315/82 |
| 5,780,980 A | 7/1998 | Naito ........................... 318/139 |
| 5,789,899 A | 8/1998 | van Phuoc et al. .......... 320/112 |
| 5,793,359 A | 8/1998 | Ushikubo .................... 345/169 |
| 5,796,239 A | 8/1998 | van Phuoc et al. .......... 320/107 |
| 5,808,469 A | 9/1998 | Kopera ........................ 324/434 |
| 5,818,234 A | 10/1998 | McKinnon .................. 324/433 |
| 5,821,756 A | 10/1998 | McShane et al. ............ 324/430 |
| 5,821,757 A | 10/1998 | Alvarez et al. .............. 324/434 |
| 5,825,174 A | 10/1998 | Parker ......................... 324/106 |
| 5,831,435 A | 11/1998 | Troy ............................ 324/426 |
| 5,850,113 A | 12/1998 | Weimer et al. .............. 307/125 |
| 5,862,515 A | 1/1999 | Kobayashi et al. ........... 702/63 |
| 5,865,638 A | 2/1999 | Trafton ........................ 439/288 |
| 5,872,443 A | 2/1999 | Williamson ................. 320/160 |
| 5,872,453 A | 2/1999 | Shimoyama et al. ........ 324/431 |
| 5,895,440 A | 4/1999 | Proctor et al. ................ 702/63 |
| 5,903,716 A * | 5/1999 | Kimber et al. ............. 358/1.13 |
| 5,912,534 A | 6/1999 | Benedict ...................... 315/82 |
| 5,914,605 A | 6/1999 | Bertness ...................... 324/430 |
| 5,927,938 A | 7/1999 | Hammerslag ............... 414/809 |
| 5,929,609 A | 7/1999 | Joy et al. ...................... 322/25 |
| 5,939,855 A | 8/1999 | Proctor et al. ............... 320/104 |
| 5,939,861 A | 8/1999 | Joko et al. ................... 320/122 |
| 5,945,829 A | 8/1999 | Bertness ...................... 324/430 |
| 5,951,229 A | 9/1999 | Hammerslag ............... 414/398 |
| 5,961,561 A | 10/1999 | Wakefield, II ................ 701/29 |
| 5,961,604 A | 10/1999 | Anderson et al. ............ 709/229 |
| 5,969,625 A | 10/1999 | Russo .................... 340/636.19 |
| 5,978,805 A | 11/1999 | Carson ......................... 707/10 |
| 5,982,138 A | 11/1999 | Krieger ....................... 320/105 |
| 6,002,238 A | 12/1999 | Champlin .................... 320/134 |
| 6,005,759 A | 12/1999 | Hart et al. .................... 361/66 |
| 6,008,652 A | 12/1999 | Theofanopoulos et al. .. 324/434 |
| 6,009,369 A | 12/1999 | Boisvert et al. .............. 701/99 |
| 6,016,047 A | 1/2000 | Notten et al. ................ 320/137 |
| 6,031,354 A | 2/2000 | Wiley et al. .................. 320/116 |
| 6,031,368 A | 2/2000 | Klippel et al. ............... 324/133 |
| 6,037,751 A | 3/2000 | Klang .......................... 320/160 |
| 6,037,777 A | 3/2000 | Champlin .................... 324/430 |
| 6,037,778 A | 3/2000 | Makhija ...................... 324/433 |
| 6,046,514 A | 4/2000 | Rouillard et al. .............. 307/77 |
| 6,051,976 A | 4/2000 | Bertness ...................... 324/426 |
| 6,055,468 A | 4/2000 | Kaman et al. ................ 701/29 |
| 6,061,638 A | 5/2000 | Joyce ........................... 702/63 |
| 6,064,372 A | 5/2000 | Kahkoska .................... 345/173 |
| 6,072,299 A | 6/2000 | Kurle et al. .................. 320/112 |
| 6,072,300 A | 6/2000 | Tsuji ............................ 320/116 |
| 6,081,098 A * | 6/2000 | Bertness et al. ............. 320/134 |
| 6,081,109 A | 6/2000 | Seymour et al. ............. 324/127 |
| 6,091,238 A | 7/2000 | McDermott .............. 324/207.2 |
| 6,091,245 A | 7/2000 | Bertness ...................... 324/426 |
| 6,094,033 A | 7/2000 | Ding et al. ................... 320/132 |
| 6,100,670 A | 8/2000 | Levesque ..................... 320/150 |
| 6,104,167 A * | 8/2000 | Bertness et al. ............. 320/132 |
| 6,114,834 A | 9/2000 | Parise .......................... 320/109 |
| 6,137,269 A | 10/2000 | Champlin .................... 320/150 |
| 6,140,797 A | 10/2000 | Dunn ........................... 320/105 |
| 6,144,185 A | 11/2000 | Dougherty et al. .......... 320/132 |
| 6,150,793 A | 11/2000 | Lesesky et al. .............. 320/104 |
| 6,158,000 A | 12/2000 | Collins .......................... 713/1 |
| 6,161,640 A | 12/2000 | Yamaguchi ................ 180/65.8 |
| 6,163,156 A | 12/2000 | Bertness ...................... 324/426 |
| 6,167,349 A | 12/2000 | Alvarez ........................ 702/63 |
| 6,172,483 B1 | 1/2001 | Champlin .................... 320/134 |
| 6,172,505 B1 | 1/2001 | Bertness ...................... 324/430 |
| 6,177,737 B1 | 1/2001 | Palfey et al. .................. 307/64 |
| 6,181,545 B1 | 1/2001 | Amatucci et al. ............ 361/502 |
| 6,211,651 B1 | 4/2001 | Nemoto ....................... 320/133 |
| 6,215,275 B1 | 4/2001 | Bean ............................ 320/106 |
| 6,222,342 B1 | 4/2001 | Eggert et al. ................. 320/105 |
| 6,222,369 B1 | 4/2001 | Champlin .................... 324/430 |
| D442,503 S | 5/2001 | Lundbeck et al. ............. D10/77 |
| 6,225,808 B1 | 5/2001 | Varghese et al. ............. 324/426 |
| 6,236,332 B1 | 5/2001 | Conkright et al. ............ 340/3.1 |
| 6,238,253 B1 | 5/2001 | Qualls ......................... 439/759 |

| | | | | | | |
|---|---|---|---|---|---|---|
| 6,242,887 B1 | 6/2001 | Burke | 320/104 | 6,788,025 B2 | 9/2004 | Bertness et al. | 320/104 |
| 6,249,124 B1 | 6/2001 | Bertness | 324/427 | 6,795,782 B2 | 9/2004 | Bertness et al. | 702/63 |
| 6,250,973 B1 | 6/2001 | Lowery et al. | 439/763 | 6,805,090 B2 | 10/2004 | Bertness et al. | 123/198 |
| 6,254,438 B1 | 7/2001 | Gaunt | 439/755 | 6,806,716 B2 | 10/2004 | Bertness et al. | 324/426 |
| 6,259,170 B1 | 7/2001 | Limoge et al. | 307/10.8 | 6,825,669 B2 | 11/2004 | Raichle et al. | 324/426 |
| 6,259,254 B1 | 7/2001 | Klang | 324/427 | 6,842,707 B2 | 1/2005 | Raichle et al. | 702/62 |
| 6,262,563 B1 | 7/2001 | Champlin | 320/134 | 6,850,037 B2 | 2/2005 | Bertness | 320/132 |
| 6,263,268 B1 | 7/2001 | Nathanson | 701/29 | 6,963,935 B1 * | 11/2005 | Young et al. | 710/29 |
| 6,271,643 B1 | 8/2001 | Becker et al. | 320/112 | 2002/0010558 A1 | 1/2002 | Bertness et al. | 702/63 |
| 6,275,008 B1 | 8/2001 | Arai et al. | 320/132 | 2002/0041175 A1 | 4/2002 | Lauper et al. | 320/106 |
| 6,294,896 B1 | 9/2001 | Champlin | 320/134 | 2002/0171428 A1 | 11/2002 | Bertness | 702/63 |
| 6,294,897 B1 | 9/2001 | Champlin | 320/153 | 2002/0176010 A1 | 11/2002 | Wallach et al. | 348/362 |
| 6,304,087 B1 | 10/2001 | Bertness | 324/426 | 2003/0025481 A1 | 2/2003 | Bertness | 324/427 |
| 6,307,349 B1 | 10/2001 | Koenck et al. | 320/112 | 2003/0036909 A1 * | 2/2003 | Kato | 704/275 |
| 6,310,481 B2 | 10/2001 | Bertness | 324/430 | 2003/0088375 A1 | 5/2003 | Bertness et al. | 702/63 |
| 6,313,607 B1 | 11/2001 | Champlin | 320/132 | 2003/0184262 A1 | 10/2003 | Makhija | 320/156 |
| 6,313,608 B1 | 11/2001 | Varghese et al. | 320/132 | 2003/0184306 A1 | 10/2003 | Bertness et al. | 324/426 |
| 6,316,914 B1 | 11/2001 | Bertness | 320/134 | 2003/0194672 A1 * | 10/2003 | Roberts et al. | 431/196 |
| 6,320,351 B1 | 11/2001 | Ng et al. | 320/104 | 2004/0000590 A1 | 1/2004 | Raichle et al. | 235/462.01 |
| 6,323,650 B1 | 11/2001 | Bertness et al. | 324/426 | 2004/0000891 A1 | 1/2004 | Raichle et al. | 320/107 |
| 6,329,793 B1 * | 12/2001 | Bertness et al. | 320/132 | 2004/0000893 A1 | 1/2004 | Raichle et al. | 320/135 |
| 6,331,762 B1 | 12/2001 | Bertness | 320/134 | 2004/0002824 A1 | 1/2004 | Raichle et al. | 702/63 |
| 6,332,113 B1 | 12/2001 | Bertness | 702/63 | 2004/0002825 A1 | 1/2004 | Raichle et al. | 702/63 |
| 6,346,795 B2 | 2/2002 | Haraguchi et al. | 320/136 | 2004/0002836 A1 | 1/2004 | Raichle et al. | 702/62 |
| 6,347,958 B1 | 2/2002 | Tsai | 439/488 | 2004/0049361 A1 | 3/2004 | Hamdan et al. | 702/115 |
| 6,351,102 B1 | 2/2002 | Troy | 320/139 | 2004/0051533 A1 | 3/2004 | Namaky | 324/426 |
| 6,356,042 B1 | 3/2002 | Kahlon et al. | 318/138 | 2004/0054503 A1 | 3/2004 | Namaky | 702/182 |
| 6,359,441 B1 | 3/2002 | Bertness | 324/426 | | | | |
| 6,359,442 B1 | 3/2002 | Henningson et al. | 324/426 | | | FOREIGN PATENT DOCUMENTS | |
| 6,363,303 B1 | 3/2002 | Bertness | 701/29 | EP | 0 022 450 A1 | 1/1981 | |
| RE37,677 E | 4/2002 | Irie | 315/83 | EP | 0 637 754 A1 | 2/1995 | |
| 6,384,608 B1 | 5/2002 | Namaky | 324/430 | EP | 0 772 056 A1 | 5/1997 | |
| 6,388,448 B1 | 5/2002 | Cervas | 324/426 | FR | 2 749 397 | 12/1997 | |
| 6,392,414 B2 | 5/2002 | Bertness | 324/429 | GB | 2 029 586 | 3/1980 | |
| 6,396,278 B1 | 5/2002 | Makhija | 324/402 | GB | 2 088 159 A | 6/1982 | |
| 6,411,098 B1 | 6/2002 | Laletin | 324/436 | GB | 2 246 916 A | 10/1990 | |
| 6,417,669 B1 | 7/2002 | Champlin | 324/426 | GB | 2 387 235 A | 10/2003 | |
| 6,424,157 B1 | 7/2002 | Gollomp et al. | 324/430 | JP | 59-17892 | 1/1984 | |
| 6,424,158 B2 | 7/2002 | Klang | 324/433 | JP | 59-17893 | 1/1984 | |
| 6,441,585 B1 | 8/2002 | Bertness | 320/132 | JP | 59-17894 | 1/1984 | |
| 6,445,158 B1 | 9/2002 | Bertness et al. | 320/104 | JP | 59017894 | 1/1984 | |
| 6,449,726 B1 | 9/2002 | Smith | 713/340 | JP | 59215674 | 12/1984 | |
| 6,456,045 B1 | 9/2002 | Troy et al. | 320/139 | JP | 60225078 | 11/1985 | |
| 6,466,025 B1 | 10/2002 | Klang | 324/426 | JP | 62-180284 | 8/1987 | |
| 6,466,026 B1 | 10/2002 | Champlin | 324/430 | JP | 63027776 | 2/1988 | |
| 6,495,990 B2 | 12/2002 | Champlin | 320/132 | JP | 03274479 | 12/1991 | |
| 6,526,361 B1 | 2/2003 | Jones et al. | 702/63 | JP | 03282276 | 12/1991 | |
| 6,529,723 B1 | 3/2003 | Bentley | 455/405 | JP | 4-8636 | 1/1992 | |
| 6,531,848 B1 | 3/2003 | Chitsazan et al. | 320/153 | JP | 04095788 | 3/1992 | |
| 6,534,993 B2 | 3/2003 | Bertness | 324/433 | JP | 04131779 | 5/1992 | |
| 6,544,078 B2 | 4/2003 | Palmisano et al. | 439/852 | JP | 04372536 | 12/1992 | |
| 6,556,019 B2 | 4/2003 | Bertness | 324/426 | JP | 5216550 | 8/1993 | |
| 6,566,883 B1 | 5/2003 | Vonderhaar et al. | 324/426 | JP | 7-128414 | 5/1995 | |
| 6,570,385 B1 | 5/2003 | Roberts et al. | 324/378 | JP | 09061505 | 3/1997 | |
| 6,577,107 B2 | 6/2003 | Kechmire | 320/139 | JP | 10056744 | 2/1998 | |
| 6,586,941 B2 * | 7/2003 | Bertness et al. | 324/426 | JP | 10232273 | 9/1998 | |
| 6,597,150 B1 | 7/2003 | Bertness et al. | 320/104 | JP | 11103503 A | 4/1999 | |
| 6,600,815 B1 | 7/2003 | Walding | 379/93.07 | RU | 2089015 C1 | 8/1997 | |
| 6,618,644 B2 | 9/2003 | Bean | 700/231 | WO | WO 93/22666 | 11/1993 | |
| 6,621,272 B2 | 9/2003 | Champlin | 324/426 | WO | WO 94/05069 | 3/1994 | |
| 6,623,314 B1 | 9/2003 | Cox et al. | 439/759 | WO | WO-9601456 * | 1/1996 | |
| 6,628,011 B2 | 9/2003 | Droppo et al. | 307/43 | WO | WO 97/44652 | 11/1997 | |
| 6,629,054 B2 | 9/2003 | Makhija et al. | 702/113 | WO | WO 98/04910 | 2/1998 | |
| 6,633,165 B2 | 10/2003 | Bertness | 324/426 | WO | WO 98/58270 | 12/1998 | |
| 6,667,624 B1 | 12/2003 | Raichle et al. | 324/522 | WO | WO 99/23738 | 5/1999 | |
| 6,679,212 B2 | 1/2004 | Kelling | 123/179.28 | WO | WO 00/16083 | 3/2000 | |
| 6,696,819 B2 | 2/2004 | Bertness | 320/134 | WO | WO 00/62049 | 10/2000 | |
| 6,707,303 B2 | 3/2004 | Bertness et al. | 324/426 | WO | WO 00/67359 | 11/2000 | |
| 6,737,831 B2 | 5/2004 | Champlin | 320/132 | WO | WO 01/59443 | 2/2001 | |
| 6,759,849 B2 | 7/2004 | Bertness | 324/426 | WO | WO 01/16614 | 3/2001 | |
| 6,777,945 B2 * | 8/2004 | Roberts et al. | 324/426 | WO | WO 01/16615 | 3/2001 | |
| 6,781,382 B2 | 8/2004 | Johnson | 324/426 | | | | |
| 6,784,637 B2 | 8/2004 | Raichle et al. | 320/107 | | | | |

WO  WO 01/51947  7/2001

OTHER PUBLICATIONS

Notification of Transmittal of the International Search Report along with the Search Report for International Application No. PCT/US03/27696, filed Sep. 4, 2003, date of mailing Apr. 15, 2004.
Operator's Manual for "Modular Computer Analyzer," SUN, Model MCA 3000, Table of Contents and pp. 1-1 to 1-2; 2-1 to 2-19; 3-1 to 3-47; 4-1 to 4-27; 5-1 to 5-18; 6-1 to 6-16; 7-1 to 7-9; 8-1 to 8-5; 9-1 to 9-13; 10-1 to 10-10; 11-1 to 11-22; 12-1 to 12-33; 13-1 to 13-2; 14-1 to 14-13 (1991).
Allen Test, Testproducts Division, "Programmed Training Course for 62-000 Series Smart Engine Analyzer," 2 page cover, Table of Contents, pp. 1-207 (1984).
"Notification of Transmittal of The International Search Report or the Declaration", PCT/US03/07837.
"Alligator Clips with Wire Penetrators" *J.S. Popper, Inc.* product information, downloaded from http://www.jspopper.com/, undated.
"#12: LM78S40 Simple Switcher DC to DC Converter", *ITM e-Catalog*, downloaded from http://www.pcbcafe.com, undated.
"Simple DC-DC Converts Allows Use of Single Battery", *Electronix Express*, downloaded from http://www.elexp.com/t_dc-dc.htm, undated.
Search Report from Application No. GB0421447.4.
Examination Report from Application No. GB0417678.0.
Champlin et al., K. S., "Results of Discrete Frequency Immittance Spectroscopy (DFIS) Measurements of Lead Acid Batteries", INTELEC 2001, Oct. 2001.
"Electrochemical Impedance Spectroscopy in Battery Development and Testing", *Batteries International*, Apr. 1997, pp. 59 and 62-63.
"Battery Impedance", by E. Willihnganz et al., *Electrical Engineering*, Sep. 1959, pp. 922-925.
"Determining The End of Battery Life", by S. DeBardelaben, *IEEE*, 1986, pp. 365-368.
"A Look at the Impedance of a Cell", by S. Debardelaben, *IEEE*, 1988, pp. 394-397.
"The Impedance of Electrical Storage Cells", by N.A. Hampson et al., *Journal of Applied Electrochemistry*, 1980, pp. 3-11.
"A Package for Impedance/Admittance Data Analysis", by B. Boukamp, *Solid State Ionics*, 1986, pp. 136-140.
"Precision of Impedance Spectroscopy Estimates of Bulk, Reaction Rate, and Diffusion Parameters", by J. Macdonald et al., *J. Electroanal, Chem.*, 1991, pp. 1-11.
Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.
IEEE Recommended Practice For Maintenance, Testings, and Replacement of Large Lead Storage Batteries for Generating Stations and Substations, *The Institute of Electrical and Electronics Engineers, Inc., ANSI/IEEE Std.* 450-1987, Mar. 9, 1987, pp. 7-15.
"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113.006, Nov. 1995.
"Performance of Dry Cells", by C. Hambuechen, Preprint of *Am. Electrochem. Soc.*, Apr. 18-20, 1912, paper No. 19, pp. 1-5.
"A Bridge for Measuring Storage Battery Resistance", by E. Willihncanz, *The Electrochemical Society*, preprint 79-20, Apr. 1941, pp. 253-258.
National Semiconductor Corporation, "High Q Notch Filter", Mar. 1969, Linear Brief 5, Mar. 1969.
Burr-Brown Corporation, "Design A 60 Hz Notch Filter with the UAF42", Jan. 1994, AB-071, 1994.
National Semiconductor Corporation, "LMF90-4$^{th}$ -Order Elliptic Notch Filter", Dec. 1994, RRD-B30M115, Dec. 1994.
"Alligator Clips with Wire Penetrators" *J.S. Popper, Inc.*product information, downloaded from http://www.jspopper.com/, undated.
"#12: LM78S40 Simple Switcher DC to DC Converters", *ITM e-Catalog*, downloaded from http://www.pcbcafe.com, undated.
"DC-DC Converter Basics", *Power Designers*, downloaded from http://www.powerdesigners.com/InforWeb.design_center/articles/DC-DC/converter.shtm, undated.
"Notification of Transmittal of The International Search Report or the Declaration", PCT/US02/29461.
"Notification of Transmittal of The International Search Report or the Declaration", PCT/US03/07546.
"Notification of Transmittal of The International Search Report or the Declaration", PCT/US03/06577.
"Notification of Transmittal of The International Search Report or the Declaration", PCT/US03/07837.
"Improved Impedance Spectroscopy Technique For Status Determination of Production Li/SO$_2$ Batteries" Terrill Atwater et al., pp. 10-113, (1992).
"Notification of Transmittal of The International Search Report or the Declaration", PCT/US03/41561.
"Notification of Transmittal of The International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
Supplementary European Search Report Communication for Appl. No. 99917402.2.
"Dynamic modelling of lead/acid batteries using impedance spectroscopy for parameter identification", Journal of Power Sources, pp. 69-84, (1997).
Notification of Transmittal of the International Search Report for PCT/US03/30707.
"A review of impedance measurements for determination of the state-of-charge of state-of-health of secondary batteries", Journal of Power Sources, pp. 59-69, (1998).
"Search Report Under Section 17" for Great Britain Application No. GB0421447.4.

* cited by examiner

ELECTRONIC BATTERY TESTER HAVING A USER INTERFACE TO CONFIGURE A PRINTER

BACKGROUND OF THE INVENTION

The present invention relates to testing of storage batteries. More specifically, the present invention relates to an electronic battery tester capable of configuring a printer.

Storage batteries, such as lead acid storage batteries of the type used in the automotive and standby power industry, have existed for many years. However, understanding the nature of such storage batteries, how such storage batteries operate and how to accurately test such batteries has been an ongoing endeavor and has proved quite difficult. Storage batteries consist of a plurality of individual storage cells electrically connected in series. Typically each cell has a voltage potential of about 2.1 volts. By connecting the cells in series, the voltages of the individual cells are added in a cumulative manner. For example, in a typical automotive storage battery, six storage cells are used to provide a total voltage when the battery is fully charged of 12.6 volts.

There has been a long history of attempts to accurately test the condition of storage batteries. A simple test is to measure the voltage of the battery. If the voltage is below a certain threshold, the battery is determined to be bad. However, this test is inconvenient because it requires the battery to be charged prior to performing the test. If the battery is discharged, the voltage will be low and a good battery may be incorrectly tested as bad. Another technique for testing a battery is referred as a load test. In a load test, the battery is discharged using a known load. As the battery is discharged, the voltage across the battery is monitored and used to determine the condition of the battery. This technique requires that the battery be sufficiently charged in order that it can supply current to the load.

More recently, a technique has been pioneered by Dr. Keith S. Champlin and Midtronics, Inc. of Willowbrook, Ill. for testing storage batteries by measuring the conductance of the batteries. This technique is described in a number of United States patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELL AND BATTERIES; U.S. Pat. No. 6,172,505, issued Jan. 9, 2001, entitled ELECTRONIC BATTERY TESTER; U.S. Pat. No. 6,222,369, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No.

6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294,897, issued Sep. 25, 2001, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,363,303, issued Mar. 26, 2002, entitled ALTERNATOR DIAGNOSTIC SYSTEM, U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Ser. No. 09/703,270, filed Oct. 31, 2000, entitled ELECTRONIC BATTERY TESTER; U.S. Ser. No. 09/780,146, filed Feb. 9, 2001, entitled STORAGE BATTERY WITH INTEGRAL BATTERY TESTER; U.S. Ser. No. 09/816,768, filed Mar. 23, 2001, entitled MODULAR BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Ser. No. 09/960,117, filed Sep. 20, 2001, entitled IN-VEHICLE BATTERY MONITOR; U.S. Ser. No. 09/908,389, filed Jul. 18, 2001, entitled BATTERY CLAMP WITH INTEGRATED CIRCUIT SENSOR; U.S. Ser. No. 09/908,278, filed Jul. 18, 2001, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Ser. No. 09/940,684, filed Aug. 27, 2001, entitled METHOD AND APPARATUS FOR EVALUATING STORED CHARGE IN AN ELECTROCHEMICAL CELL OR BATTERY; U.S. Ser. No. 60/330,441, filed Oct. 17, 2001, entitled ELECTRONIC BATTERY TESTER WITH RELATIVE TEST OUTPUT; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER, U.S. Ser. No. 60/341,902, filed Dec. 19, 2001, entitled BATTERY TESTER MODULE; U.S. Ser. No. 10/042,451, filed Jan. 8, 2002, entitled BATTERY CHARGE CONTROL DEVICE, U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 60/364,656, filed Mar. 14, 2002, entitled ELECTRONIC BATTERY TESTER WITH LOW TEMPERATURE RATING DETERMINATION; U.S. Ser. No. 10/098,741, filed Mar. 14, 2002, entitled METHOD AND APPARATUS FOR AUDITING A BATTERY TEST; U.S. Ser. No. 10/101,543, filed Mar. 19, 2002, entitled ELECTRONIC BATTERY TESTER; U.S. Ser. No. 10/112,114, filed Mar. 28, 2002; U.S. Ser. No. 10/109,734, filed Mar. 28, 2002; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 10/128,790, filed Apr. 22, 2002, entitled METHOD OF DISTRIBUTING JUMP-START BOOSTER PACKS; U.S. Ser. No. 60/379,281, filed May 8, 2002, entitled METHOD FOR DETERMINING BATTERY STATE OF CHARGE; U.S. Ser. No. 10/143,307, filed May 10, 2002, entitled ELECTRONIC BATTERY TESTER; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/207,495, filed Jul. 29, 2002, entitled KELVIN CLAMP FOR ELECTRICALLY COUPLING TO A BATTERY CONTACT; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 60/408,542, filed Sep. 5, 2002, entitled BATTERY TEST OUTPUTS ADJUSTED BASED UPON TEMPERATURE; U.S. Ser. No. 10/246,439, filed Sep. 18, 2002, entitled BATTERY TESTER UPGRADE USING SOFTWARE KEY; U.S. Ser. No. 60/415,399, filed Oct. 2, 2002, entitled QUERY BASED ELECTRONIC BATTERY TESTER; and U.S. Ser. No. 10/263,473, filed Oct. 2, 2002, entitled ELECTRONIC BATTERY TESTER WITH RELATIVE TEST OUTPUT; U.S. Ser. No. 60/415,796, filed Oct. 3, 2002, entitled QUERY BASED ELECTRONIC BATTERY TESTER; U.S. Ser. No. 10/271,342, filed Oct. 15, 2002, entitled IN-VEHICLE BATTERY MONITOR; U.S. Ser. No. 10/270,777, filed Oct. 15, 2002, entitled PROGRAMMABLE CURRENT EXCITER FOR MEASURING AC IMMITTANCE OF CELLS AND BATTERIES; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE, U.S. Ser. No. 60/437,255, filed Dec. 31, 2002, entitled REMAINING TIME PREDICTIONS, U.S. Ser. No. 60/437,224, filed Dec. 31, 2002, entitled DISCHARGE VOLTAGE PREDICTIONS, U.S. Ser. No. 10/349,053, filed Jan. 22, 2003, entitled APPARATUS AND METHOD FOR PROTECTING A BATTERY FROM OVERDISCHARGE, which are incorporated herein in their entirety.

Some battery testers communicate with a printer to print various test results. The battery tester communicates with the printer through different types of physical and non-physical interfaces. Before the battery tester can communicate with the printer through a communication interface, the printer or the tester is manually set to a printer communication protocol which allows the battery tester to communicate with the printer. Manually setting the printer communication protocol is time consuming, may introduce errors in the printing process and has limited functionality.

SUMMARY OF THE INVENTION

An apparatus for testing a storage battery includes an input configured to select a printer protocol from a plurality of printer protocols. A memory contains a plurality of printer protocol selection commands. Each of the printer protocol selection commands corresponds with each of the printer protocols. A processor is coupled to the input and the memory such that the processor can retrieve one of the plurality of printer protocol selection commands that corresponds to the selected printer protocol. A communication interface is configured to send the printer protocol selection command to a printer, the printer protocol selection command is configured to cause the printer to communicate in accordance with the selected printer protocol.

DETAILED DESCRIPTION OF THE PREFERRED EMBODIMENTS

The present invention provides an apparatus and method for configuring a printer with a printer protocol to allow the printer to communicate with a battery tester. The present invention also provides an apparatus and method for configuring a battery tester with an output protocol to allow the battery tester to transmit test data to the printer in accordance with the printer protocol. A user interface is utilized in the present invention to both configure a printer with a printer protocol and configure a battery tester with an output protocol.

Figure 1:
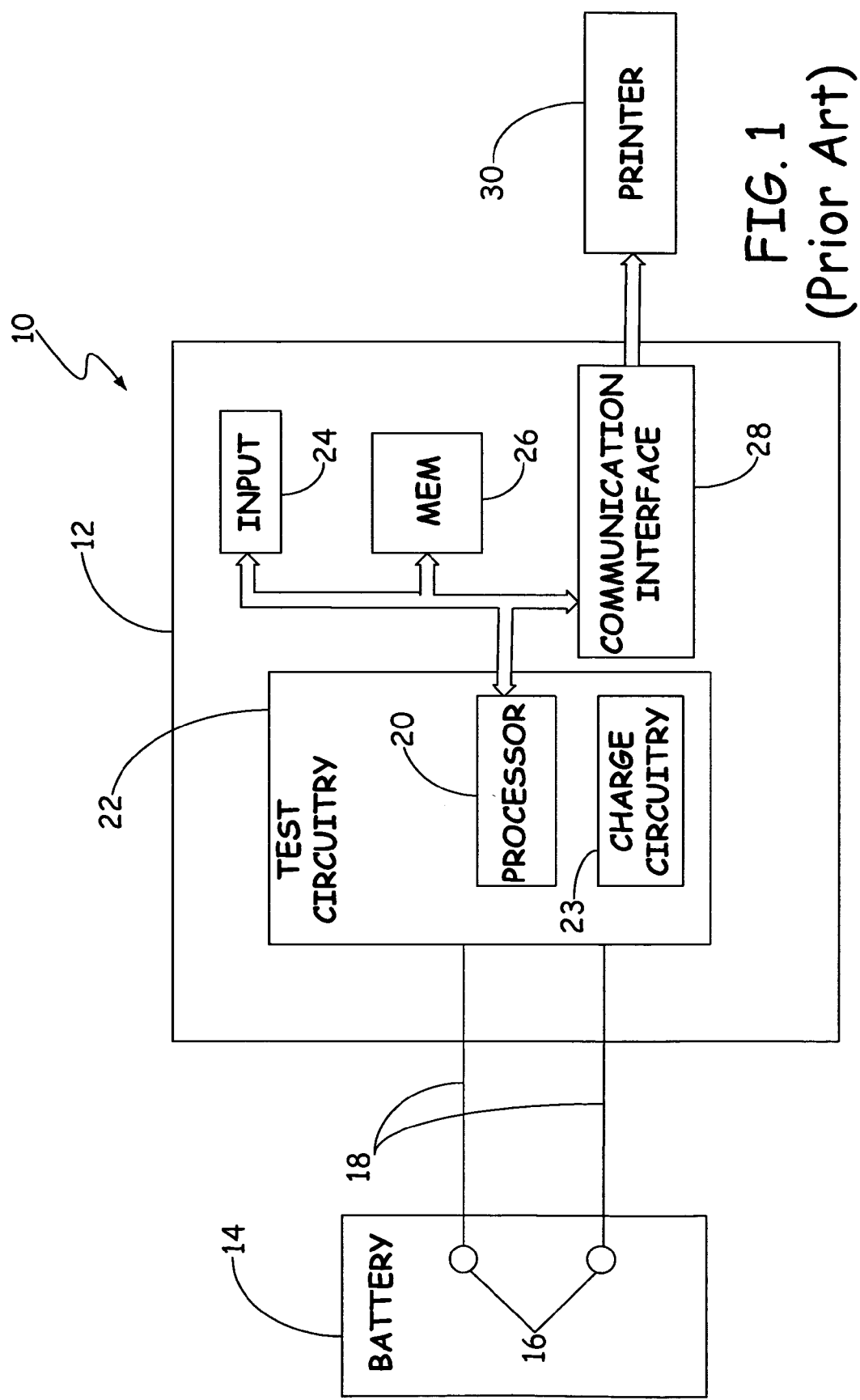
FIG. 1 is a block diagram of a battery tester coupled to a battery and a printer in accordance with the prior art.

FIG. 1 is a simplified block diagram of an electronic battery tester system 10 in which embodiments of the present invention are useful. Batter tester system 10 includes a battery tester 12 coupled to battery 14 and printer 30. Note that FIG. 1 is illustrative of a specific type of battery tester 12 which measures dynamic parameters. However, in one aspect, the present invention is applicable to any type of battery tester including those which do not use dynamic parameters. Other types of example testers include testers that conduct load tests, current based tests, voltage based tests, tests which apply various conditions or observe various performance parameters of a battery, etc.

Battery tester 12 is coupled to terminals 16 of battery 14 via connectors 18. For example, connectors 18 may provide Kelvin connections to battery 14. Battery tester 12 includes test circuitry 22. Test circuitry 22 contains processor 20 and other circuitry configured to measure a dynamic parameter of battery 14. As used herein, a dynamic parameter is one which is related to a signal having a time varying component. The signal can be either applied to or drawn from battery 14. In addition, test circuitry 22 may further include battery charge circuitry 23 to charge battery 14. Charge circuitry 23 is capable of determining the status of battery 14, making advanced decisions about charging battery 14 and selecting a particular charging profile used in such charging.

Besides assisting in measuring dynamic and non-dynamic parameters of battery 14 and charging battery 14, processor 20 also controls the operation of other components within battery tester 12. Battery tester 12 also includes input 24, memory 26 and communication interface 28. Processor 20 controls the operation of these and other components within test circuitry 22 and, in turn, carries out different battery testing functions based upon battery testing instructions stored in memory 26.

Generally, battery tester 12 is in communication with printer 30 via communication interface 28 such that printer 30 will print test data provided by test circuitry 22. Test circuitry 22 in conjunction with processor 20 is configured to send measurement information via an output or measurement output 21 to printer 30 to print test data. In order for test circuitry 22 to communicate with printer 30, printer 30 is configured with a printer protocol corresponding to the particular interface that communication interface 28 is using.

The printer protocol is changed manually by a multiple button pressing sequence on printer 30. This method of changing the printer protocol of printer 30 is time consuming and presents many possibilities of error in button pressing. To eliminate these unwanted printer conditions the present invention is a battery tester 12 which includes a user-friendly input for configuring printer 30 with a printer protocol. The user-friendly input therein eliminates the multiple manual button pressing on printer 30.

Figure 2:
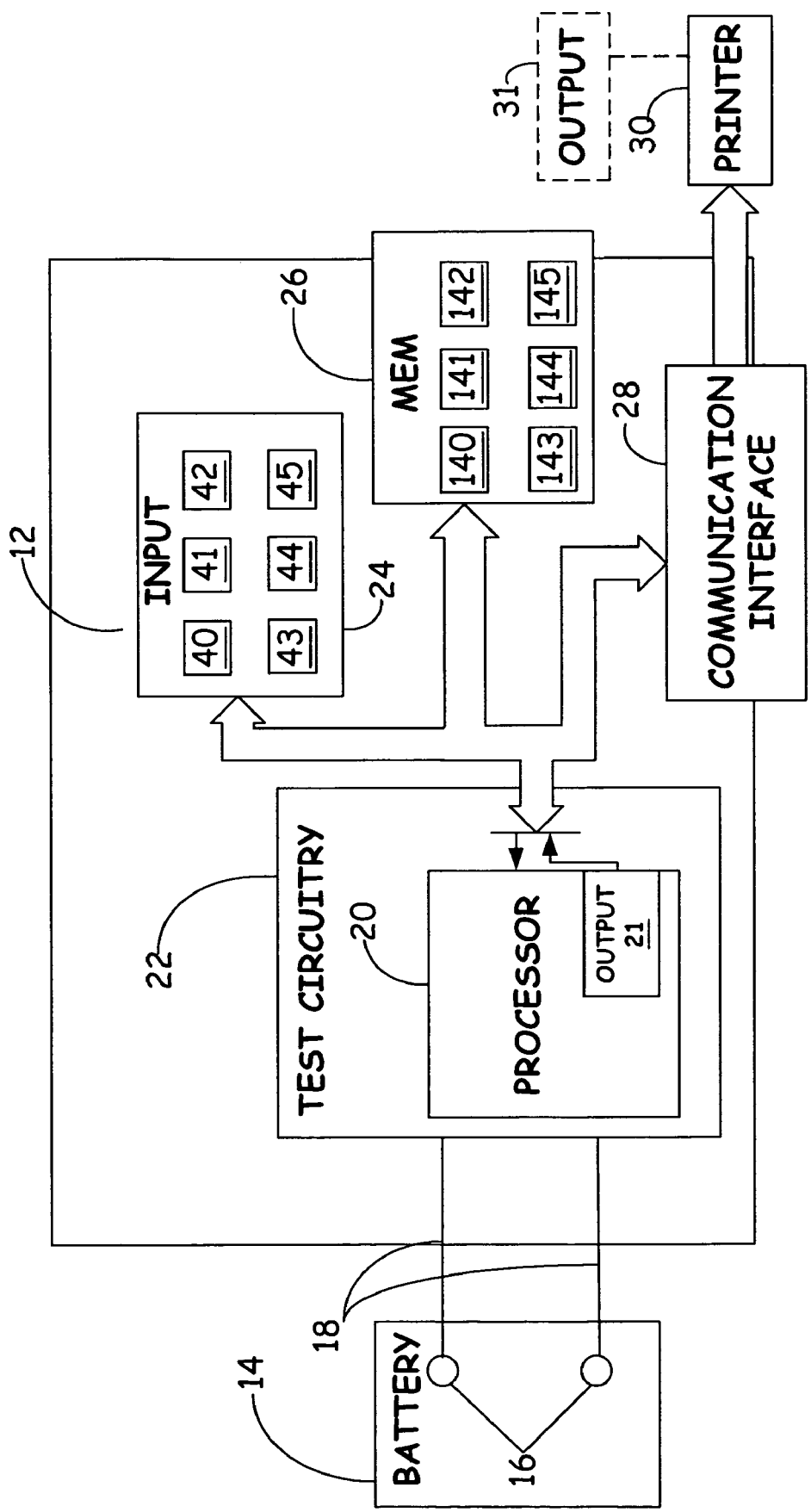
FIG. 2 is a block diagram illustrating data stored in a memory of a battery tester in accordance with an embodiment of the present invention.

FIG. 2 is a simplified block diagram of battery tester 12 in accordance with an embodiment of the present invention. In one aspect of the invention, input 24 is a user input configured to receive one of a plurality of protocols 40-45 from the user. Protocols 40-45 each represent a type of printer protocol associated with configuring printer 30. Memory 26 contains a plurality of printer protocol selection commands 140-145 corresponding to the plurality of printer protocols 40-45 of input 24.

Each of the plurality of protocols 40-45 that correspond with each of the plurality of selection commands 140-145 are associated with a type of communication interface 28 that is being used to send measurement information to printer 30. For example, communication- interface 28 can be a Recommended Standard 232 (RS232) interface having a registered jack 12 (RJ12) socket which is standardized by the Federal Communications Commission (FCC). The RS232 interface connects to the printer by a physical link such as a cable. In another example, communication interface 28 can be a Hewlett Packard Infrared (HPIR) interface. In yet another example, communication interface 28 can be an Infrared Data Association (IrDA) interface as standardized by the IrDA. Both the HPIR and IrDA interfaces are infrared non-physical interfaces. This list of example interfaces is not exhaustive, for example, communication interface 28 can use other forms of physical and non-physical interfaces. Examples of non-physical interfaces include ultrasonic and radio frequencies.

Each of the plurality of printer protocol selection commands 140-145 contain a command or set of commands which configure printer 30. For example, printer 30 can be configured to an IrDA protocol, a HPIR protocol or a RS232 protocol. This list is not exhaustive and can include any type of protocol corresponding to any interface that includes a physical or non-physical interface to printer 30. In one example, protocol 40 in input 24 represents an IrDA protocol which corresponds with protocol selection command 140. Protocol selection command 140 contains a command or set of commands to configure printer 30 to an IrDA protocol. Upon the user selecting protocol 40, processor 20 accesses memory 26 and retrieves the corresponding printer protocol selection command 140. Processor 20 sends protocol selection command 140 via communication interface 28 to configure printer 30 with an IrDA protocol. In another example, protocol 41 in input 24 represents a HPIR protocol and corresponds with protocol selection command 141 which contains a command or set of commands to configure printer 30 to a HPIR protocol. Upon the user selecting protocol 41, processor 20 accesses memory 26 and retrieves the corresponding protocol selection command 141. Processor 20 sends protocol selection command 141 via communication interface 28 to configure printer 30 with a HPIR protocol.

In response to the protocol selection command sent from memory 26, printer 30 will complete some or all of the following steps: 1) change its protocol; 2) complete a linefeed of the paper in printer 30; and 3) print a short text string. The linefeed and the text string are printer outputs (indicated at output 31). The printed text string indicates the output that printer 30 is ready to accept that relates to the type of interface that communication interface 28 is using.

Figure 3:
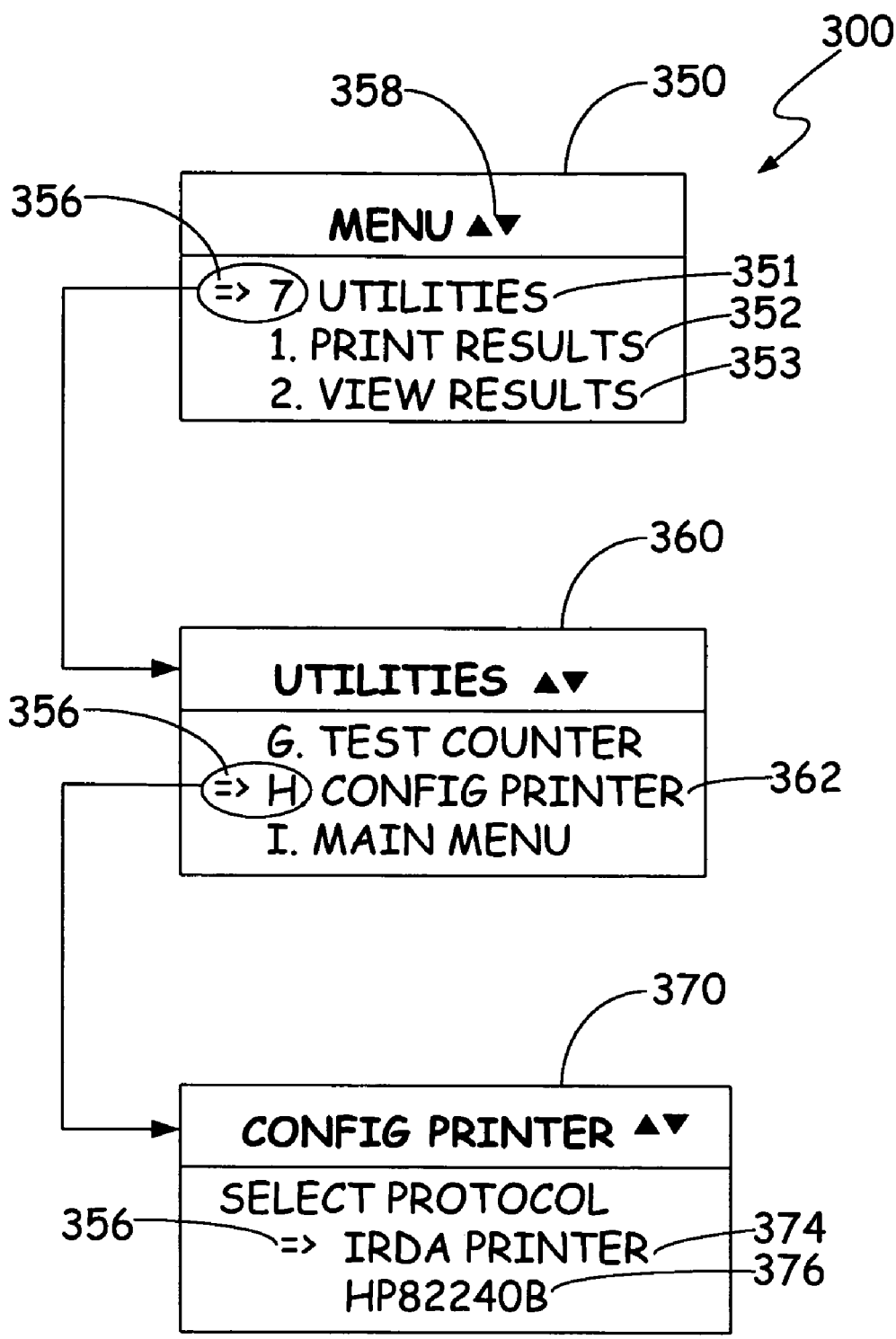
FIG. 3 is a block diagram of a layered menu interface displaying user options to configure a printer with a printer protocol in accordance with an embodiment of the present invention.

In another aspect of the present invention, the user-friendly input 24 is an input containing a user friendly layered menu interface 300. FIG. 3 illustrates layered menu interface 300 displaying user options to configure printer 30 with a printer protocol. For example, layered menu 300 can be graphically displayed on a liquid crystal display (LCD).

Layered menu interface 350 includes a plurality of menu levels 350, 360 and 370. In level one 350 of layered menu interface 300, a plurality of options for testing a storage battery. For example, PRINT RESULTS, VIEW RESULTS, QC (quality control) MODE, VOLTMETER, EXPORT DATA and PERFORM TEST are frequently used functions in battery tester 12 that can be selected in level one 350. If PRINT RESULTS is selected, then tester 12 will send test data from the last test result to printer 30 for printing. If VIEW RESULTS is selected, then tester 12 will display test data from the last test result on the LCD display. If QC MODE is selected, then tester 12 will save test data into memory locations. If VOLTMETER is selected, the tester will function as a voltmeter. If EXPORT DATA is selected, tester 12 will send test data in a format that can be displayed on a personal computer (PC) having PC software. If PERFORM TEST is selected, tester 12 will perform a test. Note that in this embodiment of the invention layered menu interface 300 can only display three options at one time on the LCD. However, the present invention encompasses any amount of options that can be displayed at any level of layered menu 300. In FIG. 3, the corresponding PRINT RESULTS and VIEW RESULTS options are options 352 and 353.

Another option in level one 350 is option 351 labeled UTILITIES. Utility option 351 allows access to infrequently used menu selections. The user can select utility option 351 by using the up/down arrows 358 to move the horizontal arrow 356 next to utility option 351. After selection, level two 360 displays the list of utility options.

Examples of utility options in layered menu interface 300 can include options such as COUPON MODE, PRINTER TYPE, LANGUAGE, CONTRAST, SET DATA AND TIME, SET ADDRESS, TEST COUNTER, CONFIG PRINTER and MAIN MENU. By selecting the main menu option, the user is brought back to level one 350 of layered menu 300. This is not an exhaustive list of utility options that can be found in level two 360, for example, other infrequently used functions for battery tester 12 can be listed on level two 360 of layered menu 300.

To configure printer 30 with a printer protocol that corresponds to the type of interface that communication interface 28 is using, the user selects option 362 labeled CONFIG PRINTER from the list of utility options by moving horizontal arrow 356 adjacent option 362. After selection, level three 370 is displayed wherein the user selects the corresponding protocol. For example, the user can select either option 374 labeled IRDA PRINTER or option 376 labeled HP82240B. IRDA PRINTER refers to an IrDA protocol and HP82240B refers to a HPIR protocol. For example, if communication interface 28 is an IrDA interface, then the horizontal arrow 356 should be moved adjacent to option 374. If the communication interface 28 is a HPIR interface, then the horizontal arrow 356 should be moved adjacent to option 376. This is not an exhaustive list of options that can be found in level three 370. Other protocols for battery tester 12 can be listed on level three 370 of layered menu 300. For example, a RS232 protocol can be an option.

After selection of one of the above protocols, processor 20 accesses memory 26 and retrieves one of the plurality of protocol selection commands which matches the selection made in level three 370. Processor 20 sends the command or set of commands found in one of the plurality of protocol selection commands to configure printer 30 via the communication interface 28.

Figure 4:
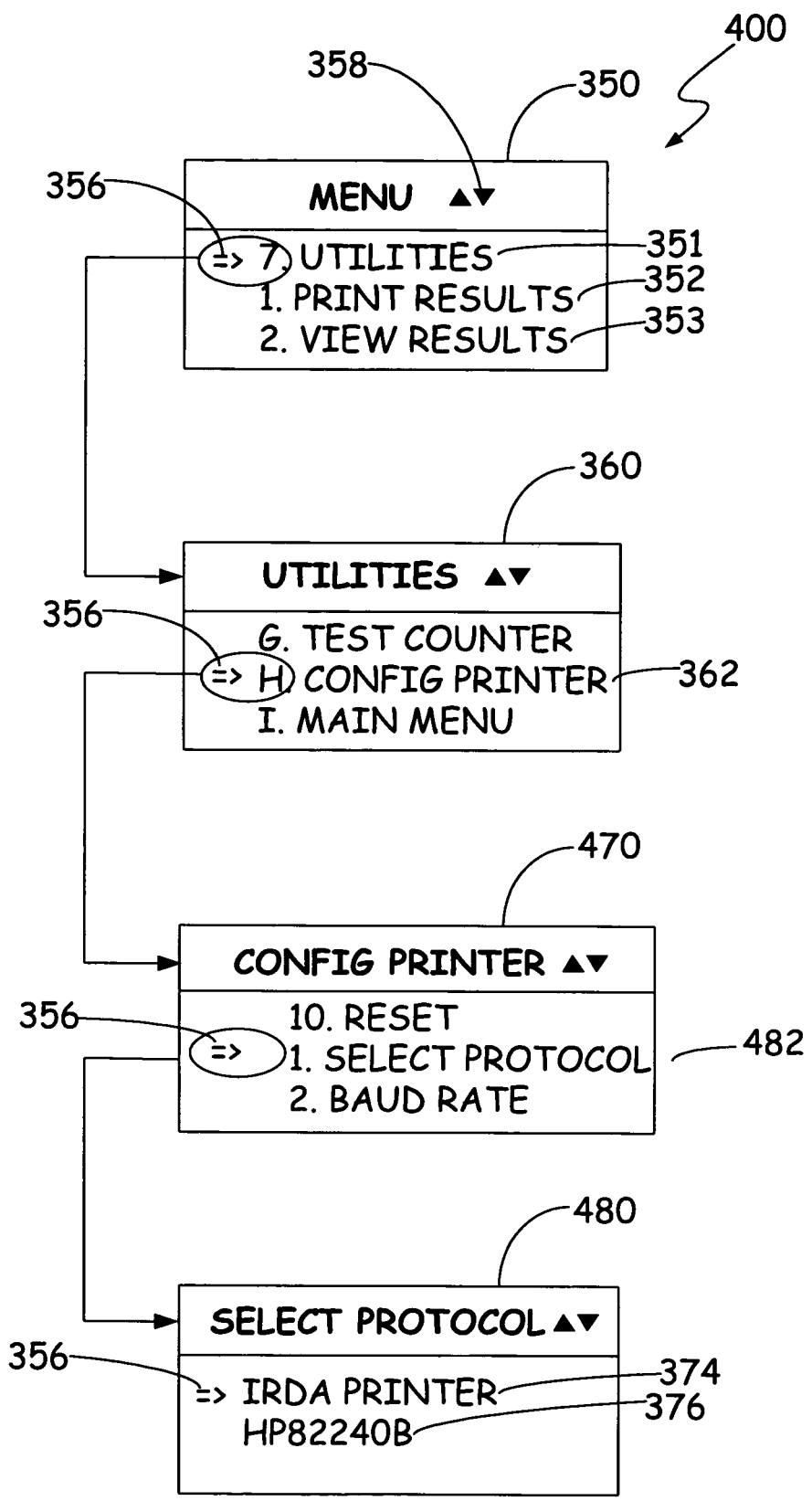
FIG. 4 is a block diagram of a layered menu interface displaying user options to configure a printer with a printer protocol in accordance with an embodiment of the present invention.

In yet another aspect of the present invention, layered menu interface 300 can be layered menu interface 400 of FIG. 4. FIG. 4 illustrates layered menu interface 400 displaying user options to configure printer 30 with a printer protocol. For example, layered menu 400 can be graphically displayed on a LCD.

Layered menu interface 400 includes a plurality of menu levels 350, 360, 470 and 480. Level one 350 and level two 360 are illustrated in FIG. 3. However, layered menu interface 400 also includes level three 470 in place of level three 370 of FIG. 3 as well as level four 480. Unlike level three 370 of FIG. 3, level three 470 includes a plurality of options for configuring printer 30. Besides SELECT PROTOCOL, other examples of possible additional selections in level three 470 can include BAUD RATE, FLOW CONTROL, FONT, CHARACTER SCALING, PRINT DENSITY, PRINTER CURRENT, FEED CONTROL, AUTO OFF and RESET. This is not an exhaustive list of options that can be found in level three 470, for example, other options for configuring printer 30 can be listed on level three 470 of layered menu 400.

To configure printer 30 with a printer protocol that corresponds to the type of interface that communication interface 28 is using, the user selects option 482 from the list of options by moving horizontal arrow 356 adjacent option 482. After selection, level four 480 is displayed wherein the user selects the corresponding protocol as described in level three 370 of FIG. 3.

Figure 5:
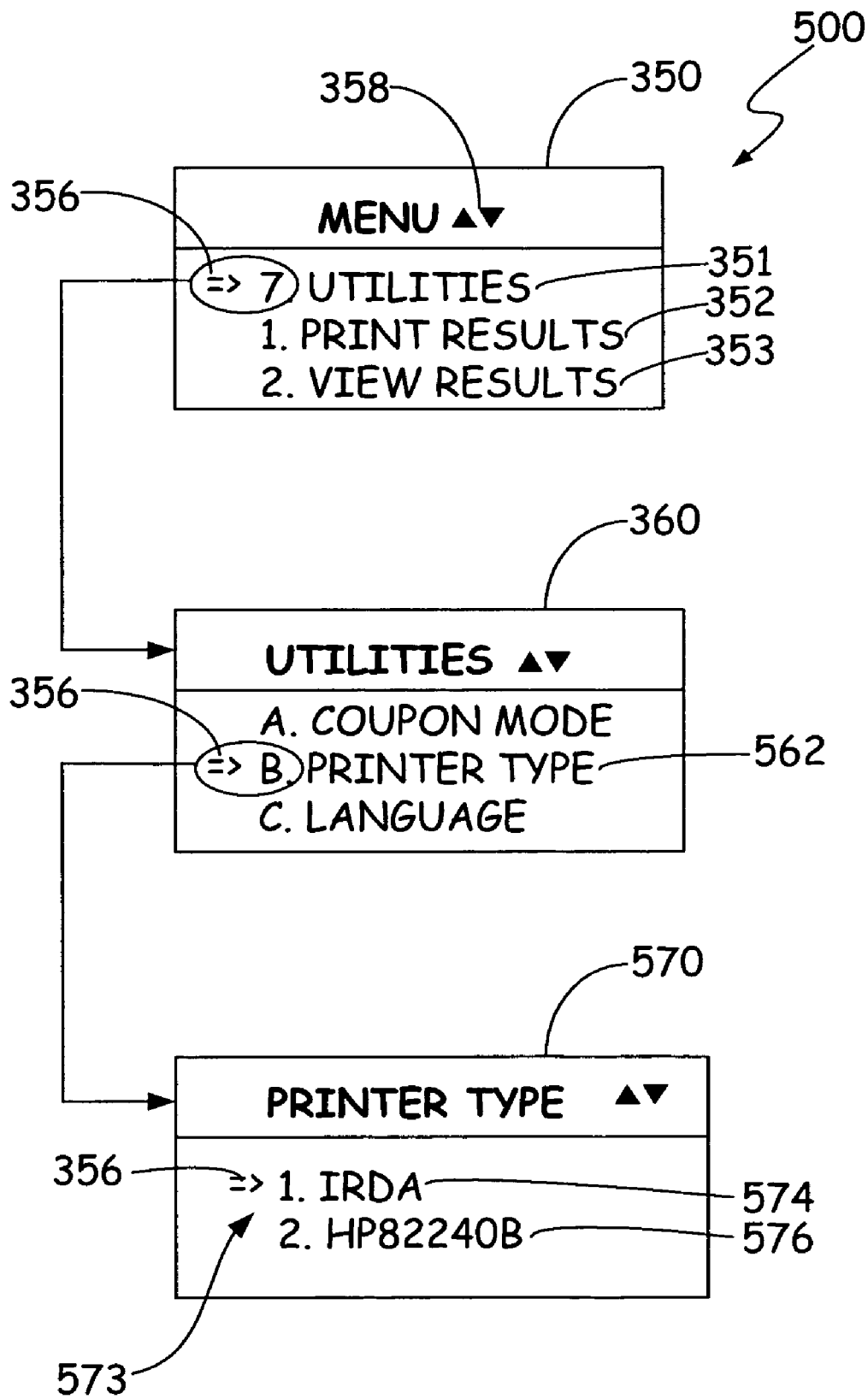
FIG. 5 is a block diagram of a layered menu interface displaying user options to configure a battery tester to transmit test data to a printer in accordance with the selected printer protocol.

In yet another aspect of the present invention, battery tester 12 is configured with an output protocol to allow tester 12 to transmit test data to printer 30 in accordance with the selected printer protocol. FIG. 5 illustrates layered menu interface 500 displaying user options to configure tester 12 with an output protocol. For example, layer menu interface 500 can be graphically displayed on a LCD.

Layered menu interface 500 includes a plurality of menu levels 350, 360 and 570. Layered menu interface 500 includes level one 350 and level two 360 of FIG. 3. However, layered menu interface 500 also includes level three 570. To configure tester 12 with an output protocol, the user selects option 562 labeled PRINTER TYPE in level two 360. Level three 570 includes a plurality of output protocols 573. For example, the user can select either option 574 labeled IRDA or option 576 labeled HP82240B. If printer 30 is configured with an IrDA protocol then horizontal arrow 356 should be moved adjacent option 374. If printer 30 is configured with a HPIR protocol then horizontal arrow 356 should be moved adjacent option 376. This is not an exhaustive list of output protocols that can be found in level three 570. Other output protocols can be listed on level three 570 of layered menu 300. For example, a RS232 output protocol that corresponds to an RS232 printer protocol can be an option.

Figure 6:
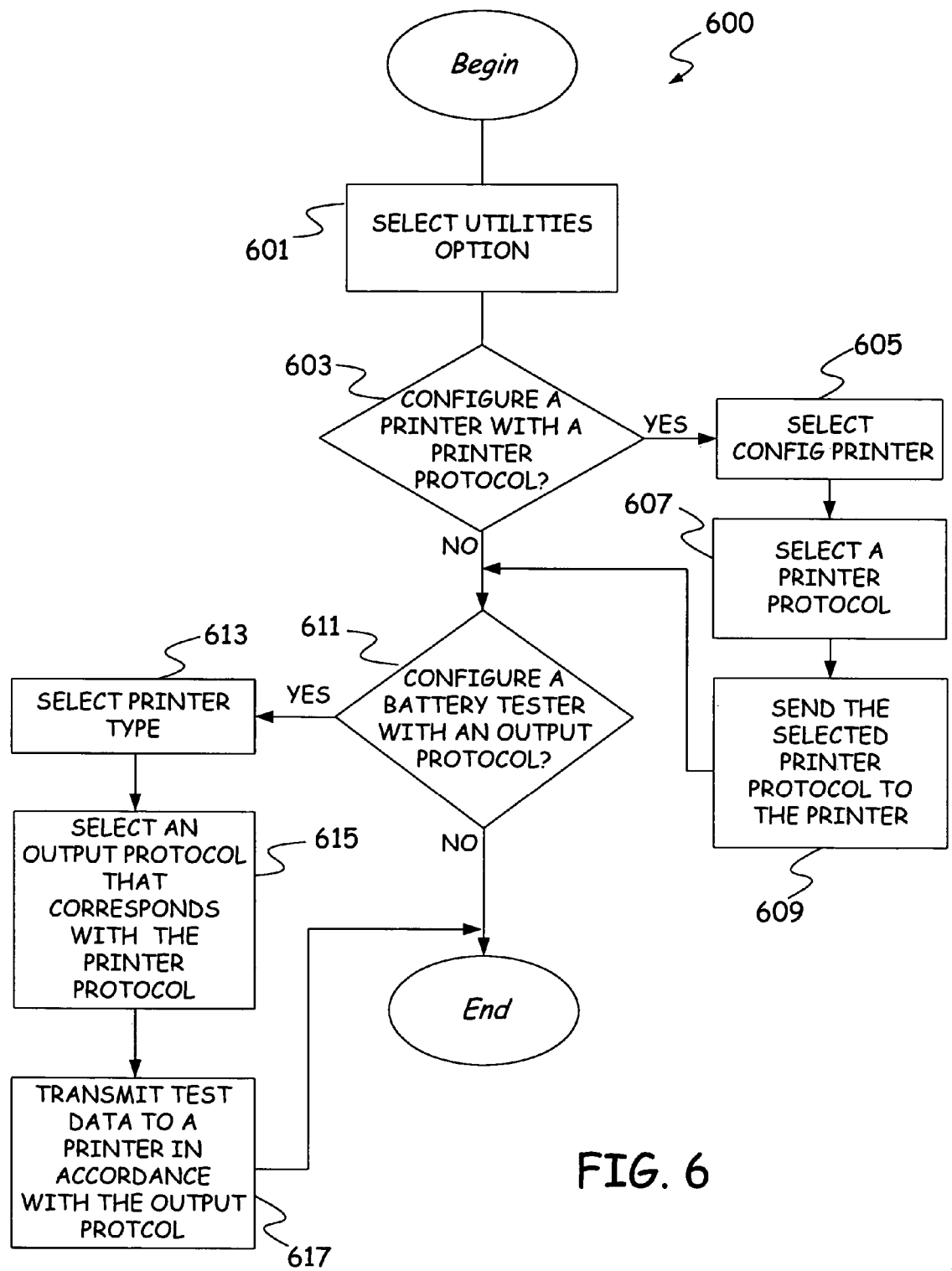
FIG. 6 is a flowchart illustrating a method for a user to interact with a user interface.

FIG. 6 is a flowchart 600 which illustrates an example process with which a user interacts with layered menu interfaces 300, 400 and 500 in battery tester 12 to configure printer 30 with a printer protocol and/or configure tester 12 with an output protocol to transmit test data in accordance with the printer protocol. The method begins at first step 601 where the user selects the UTILITIES option from the plurality of infrequently used selections of layered menu interface 300, 400 and 500.

At step 603, the user determines whether printer 30 needs to be configured with a printer protocol. If printer 30 needs configuration, the process advances to step 605. At step 605, the user selects the CONFIG PRINTER option from the plurality of user options in second level 360 of FIG. 3. Selection of the CONFIG PRINTER option allows third level 370 of FIG. 3 to be displayed. At step 607, the user selects a printer protocol from the plurality of printer protocols in level 370. At step 609, the selected printer protocol is sent to printer 30 to configure printer 30. If printer 30 does not need to be configured, the process passes control from step 603 to step 611.

At step 611, the user determines whether battery tester 12 needs to be configured with an output protocol. If the tester 12 needs to be configured, the process advances to step 613. At step 613, the user selects the PRINTER TYPE option from the plurality of user options in second level 360 of FIG. 5. Selection of the PRINTER TYPE option allows third level 570 of FIG. 5 to be displayed. At step 615, the user selects an output protocol from the plurality of output protocols that correspond with the previously selected printer protocol. After the output protocol has been selected the process ends. If tester 12 does not need to be configured, the method also ends.

The above method is not an exhaustive list of levels in which a user can interact with a user interface. For example, step 607 can further include the user selecting a SELECT A PROTOCOL option from a plurality of configure printer options in third level 470 of FIG. 4. The plurality of configure printer options include other options for configuring a printer besides selecting a printer protocol (see the description associated with FIG. 4). Selection of the SELECT A PROTOCOL option allows fourth level 480 to be displayed. The user selects a printer protocol from a plurality of printer protocols in the fourth level.

Although the present invention has been described with reference to preferred embodiments, workers skilled in the art will recognize that changes may be made in form and detail without departing from the spirit and scope of the invention.

What is claimed is:

1. An apparatus for testing a storage battery, the apparatus comprising:

test circuitry coupled to the storage battery and configured to provide a measurement output related to a condition of the storage battery;

a display configured to display a plurality of printer protocols;

a plurality of communication interfaces configured to provide communication with a printer;

an input configured to receive a user input which identifies a printer protocol from the plurality of printer protocols;

a memory configured to contain a plurality of printer protocol selection commands associated with each of the printer protocols each of the plurality of a printer protocol associated with at least one of the plurality of communication interfaces;

a processor coupled to the input and the memory, the processor configured to retrieve a plurality of printer protocol selection command in the memory that corresponds to the selected printer protocol, the processor further coupled to the test circuitry and configured to generate test data associated with the measurement output which is related to battery condition;

wherein the communication interfaces are coupled to the processor and configured to send the printer protocol selection command to the printer, the printer protocol selection command configured to cause the printer to communicate in accordance with the selected printer protocol and containing a command to configure the printer; and wherein the input further includes a layered menu interface having a plurality of menu levels which includes a configure printer option, wherein if the configure printer option is selected, then the layered menu interface displays a third level comprising the plurality of printer protocols, wherein if the printer type is selected, then the layered menu interface displays a third level comprising a plurality of output protocols for configuring the apparatus to transmit the test data to the printer in accordance with the selected printer protocol.

2. The apparatus of claim 1, wherein the test circuitry further includes charging circuitry to charge the storage battery.

3. The apparatus of claim 1, wherein the input comprises a user input.

4. The apparatus of claim 1, wherein the test circuitry is coupled to the storage battery with Kelvin connections.

5. The apparatus of claim 1, wherein the apparatus is further configured with an output protocol to transmit the test data to the printer in accordance with the selected printer protocol.

6. The apparatus of claim 1, wherein the printer receives the selected printer protocol, completes a linefeed and prints a text string indicating an output that the printer is ready to accept.

7. The apparatus of claim 1, wherein the layered menu interface has a first level comprising options for testing the storage battery.

8. The apparatus of claim 1, wherein the layered menu interface has a second level comprising utility options.

9. The apparatus of claim 8, wherein the utility options comprise: coupon mode, printer type, language, contrast, set data and time, set address, test counter and configure printer.

10. The apparatus of claim 1, wherein the plurality of printer protocols include an Infrared Data Association (IrDA) protocol, a Hewlett Packard Infrared (HPIR) protocol and a Recommended Standard 232 (RS232) protocol.

11. The apparatus of claim 1, wherein if the configure printer option is selected, then layered menu interface displays a level comprising a plurality of options including: select a protocol, baud rate, flow control, font, character scaling, print density, printer current, feed control, auto off and reset.

12. The apparatus of claim 11, wherein if the select a protocol option is selected, then the layered menu interface displays a fourth level comprising the plurality of printer protocols, wherein the printer protocols include an Infrared Data Association (IrDA) protocol, a Hewlett Packard Infrared (HPIR) protocol and a Recommended Standard 232 (RS232) protocol.

* * * * *